(12) United States Patent
Illgen et al.

(10) Patent No.: US 8,466,018 B2
(45) Date of Patent: Jun. 18, 2013

(54) METHODS OF FORMING A PMOS DEVICE WITH IN SITU DOPED EPITAXIAL SOURCE/DRAIN REGIONS

(75) Inventors: Ralf Illgen, Dresden (DE); Stefan Flachowsky, Dresden (DE); Ina Ostermay, Berlin (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/190,940

(22) Filed: Jul. 26, 2011

(65) Prior Publication Data
US 2013/0029463 A1    Jan. 31, 2013

(51) Int. Cl.
*H01L 21/8238* (2006.01)
*H01L 21/70* (2006.01)

(52) U.S. Cl.
USPC ............................ 438/199; 438/232; 257/369

(58) Field of Classification Search
USPC ............................ 438/199–233; 257/368–401
See application file for complete search history.

(56) References Cited

U.S. PATENT DOCUMENTS

| | | | |
|---|---|---|---|
| 6,621,131 B2 * | 9/2003 | Murthy et al. ................. 257/408 |
| 7,608,499 B2 | 10/2009 | Romero et al. | |
| 7,723,174 B2 | 5/2010 | Waite et al. | |
| 7,732,285 B2 | 6/2010 | Sell et al. | |
| 7,897,465 B2 | 3/2011 | Hwang et al. | |
| 7,939,852 B2 | 5/2011 | Pal et al. | |
| 8,022,473 B2 | 9/2011 | Hwang et al. | |
| 8,026,134 B2 | 9/2011 | Griebenow et al. | |
| 8,034,669 B2 | 10/2011 | Griebenow et al. | |
| 2004/0018702 A1 * | 1/2004 | Ito et al. ........................ 438/530 |
| 2008/0124875 A1 * | 5/2008 | Liao et al. ..................... 438/285 |
| 2010/0047985 A1 * | 2/2010 | Dakshina Murthy et al. | 438/303 |
| 2010/0193882 A1 * | 8/2010 | Hoentschel et al. ........... 257/410 |
| 2011/0127617 A1 * | 6/2011 | Scheiper et al. .............. 257/402 |

* cited by examiner

*Primary Examiner* — N Drew Richards
*Assistant Examiner* — Karen Kusumakar
(74) *Attorney, Agent, or Firm* — Williams, Morgan & Amerson, P.C.

(57) ABSTRACT

Disclosed herein is a method of forming a semiconductor device. In one example, the method includes forming extension implant regions in a PMOS region and a NMOS region of a semiconducting substrate for a PMOS device and a NMOS device, respectively and, after forming the extension implant regions, performing a first heating process. The method further includes forming a plurality of cavities in the PMOS region of the substrate, performing at least one epitaxial deposition process to form a plurality of in-situ doped semiconductor layers that are positioned in or above each of said cavities, and forming a masking layer that exposes the NMOS region and covers the PMOS region. The method concludes with the steps of forming source/drain implant regions in the NMOS region of the substrate for the NMOS device and performing a second heating process.

21 Claims, 5 Drawing Sheets

METHODS OF FORMING A PMOS DEVICE WITH IN SITU DOPED EPITAXIAL SOURCE/DRAIN REGIONS

BACKGROUND OF THE INVENTION

1. Field of the Invention

Generally, the present disclosure generally relates to the manufacturing of sophisticated semiconductor devices, and, more specifically, to a PMOS device with source/drain regions that include in-situ doped epitaxial grown semiconductor materials, such as silicon germanium, and methods of making such a device.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NMOS) and/or P-channel transistors (PMOS), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends upon a variety of factors, such as the dopant concentration, the mobility of the charge carriers and, for a given extension of the channel region in the transistor width direction, on the distance between the source and drain regions, which is also referred to as channel length.

There is a constant and continuous drive to increase the performance of NMOS and PMOS transistor devices. One technique for improve such performance is to reduce the channel length of the transistor device. For example, the gate length of such transistors has been dramatically reduced in the past 20 years to improve the switching speed and drive current capability of such devices. The progress has been such that current day transistor devices have gate lengths of approximately 0.3-0.8 µm and further reductions are anticipated in the future. In fact, reducing the physical size of the transistor has progressed so far, and been so effective, that further reductions in the size of such transistors or "scaling" may be difficult to achieve with existing manufacturing tools and techniques. Thus, device designer have resorted to other techniques to improve the performance of NMOS and PMOS transistor devices. In addition to scaling, another technique used to increase the performance of transistor devices has been to incorporate more sophisticated materials into such devices, e.g., the use of metal gate electrodes, the use of so-called high-k dielectric materials (k value greater than 10) and the use of copper based metallization layers. For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. Another technique used to improve device performance is related to establishing certain stresses in the channel region of the transistors. One technique for accomplishing this typically involves forming one or more layers of material, such as silicon nitride, above the transistor that imparts or induces the desired stress in the channel region of the device. In general, it is desirable to create a tensile stress in the channel region of NMOS transistors to increase their performance. In contrast, it is desirable to create a compressive stress in the channel region of the PMOS transistors. The techniques employed in forming such stress inducing layers for selective channel stress engineering purposes are well known to those skilled in the art. Another technique that may be employed to induce the desired compress stress in the channel region of a PMOS device involves forming cavities in the substrate adjacent the gate electrode structure and thereafter epitaxially depositing one or more layer of material, such as silicon germanium, in the cavities. These epitaxially deposited layers tend to induce the desired compressive stress in the channel region of the PMOS device.

One illustrative prior art technique for forming illustrative NMOS and PMOS devices will be described with reference to FIGS. 1A-1F. FIG. 1A is a simplified view of an illustrative semiconductor device 100 at an early stage of manufacturing that is formed above a semiconducting substrate 10. The device 100 generally includes an illustrative PMOS transistor 100P and an illustrative NMOS transistor 100N formed in an PMOS region 10P and an NMOS region 10N, respectively, of the substrate 10. The illustrative transistors 100N, 100P are separated by an illustrative isolation structure 12, e.g., a shallow trench isolation structure, formed in the substrate 10. In one illustrative embodiment, the semiconducting substrate 10 is comprised of bulk silicon. The substrate 10 may have a variety of configurations, like a silicon-on-insulator (SOI) structure having a bulk silicon layer, a buried insulation layer and an active layer.

At the point of fabrication depicted in FIG. 1A, each of the PMOS transistor 100P and the NMOS transistor 100N includes a gate electrode structure 14 that includes an illustrative gate insulation layer 14A and an illustrative gate electrode 14B. Also depicted in FIG. 1A is an illustrative gate cap layer 15, such as silicon nitride. The materials of construction for the gate electrode structures 14 may be different for the PMOS transistor 100P and the NMOS transistor 100N. For example, the NMOS transistor 100N may have a gate insulation layer 14A comprised of silicon dioxide and a gate electrode 14B made of polysilicon, while the PMOS transistor 100P may have a gate insulation layer 14A comprised of a high-k (k greater than 10) dielectric material and a gate electrode 14B made of one or more layers of metal. The configuration and composition of these structures may also vary depending upon the application, and they may be manufactured using techniques well known to those skilled in the art, e.g., deposition of the appropriate layers of material followed by performing one or more etching processes to define the gate electrode structures 14 with the gate cap layer 15 positioned thereabove.

FIG. 1B depicts the device 100 after several operations have been performed. First a layer of spacer material 16, e.g., silicon nitride is blanket-deposited across the device 100. The NMOS region 10N is the covered using a mask layer (not shown). An anisotropic etching process is then performed to for the sidewall spacers 18 adjacent the gate electrode structure 14 of the PMOS device 100P. Next, one or more etching processes are performed to define a plurality of cavities 17 in the substrate 10 in the PMOS region 10P. The size and depth of the cavities 17 may vary depending on the particular application. The spacers 18 act to limit how close the cavities are positioned to the gate electrode structure 14 of the PMOS device 100P. Thereafter, a two-step epitaxial deposition process is performed to form layers 20 and 22 in the cavities 17. In one example, the layer 20 is an undoped, strain inducing, layer of silicon germanium with a germanium content of about 20%. Depending upon the particular application, the thickness of layer 20 may range from 40-50 nm. In one embodiment, the layer 22 is an undoped, layer of silicon. Depending upon the particular application, the thickness of layer 22 may range from 15-20 nm.

Next, as shown in FIG. 1C, in one example, one or more etching process are performed to remove the layer of spacer material 16 and the spacers 18. Then, as shown in FIG. 1D, sidewall spacers 24 are formed adjacent the gate electrode structures 14 of the PMOS transistor 100P and the NMOS transistor 100N using known techniques. At this point, various ion implantation processes are performed to form certain doped region, e.g., halo implant regions, extension implant regions, etc., in the substrate 10. For clarity, the halo implant regions and the extension implant regions are not depicted in the drawings. These implant regions are made using known implant techniques and dopant materials.

Next, as shown in FIG. 1E, additional spacers 26 are formed adjacent the spacers 24 using known techniques and materials. The spacers 26 are added to properly locate the deep source/drain implant regions that will be formed next by performing known ion implant techniques using dopant materials that are known to those skilled in the art. Again, for clarity, the deep source/drain implant regions are not depicted in FIG. 1E.

Next, the device 100 may be subjected to one or more heating process to repair damage to the lattice structure of the substrate 10 resulting from the ion implantation processes, and to activate the implanted dopant materials. In one example, a rapid thermal anneal process is performed followed by performing a very quick, millisecond ultra-fast anneal (UFA) process. This results in the schematically depicted source/drain regions 30 depicted in FIG. 1F. Thereafter, the device is subjected to additional processing operations to complete fabrication of the device 100; e.g., the formation of metal silicide regions on the source/drain regions 30, the formation of various contacts and metallization layers, etc.

One problem associated with the prior art process flow described above is that the layers 20, 22 are subjected to the implantation processes described above: halo implant, extension implant and source/drain implants, and suffer the associated damage to the lattice structure of those layers 20, 22. Additionally, when the layers 20, 22 are subjected to the heating processes to repair the damaged lattice structure and to activate the implanted ions, the layers 20, 22 tend to relax and, as a result, impart less compressive stress to the channel region of the PMOS device 100P. In turn, this reduction in compressive stress tends to reduce the performance capabilities of the PMOS device 100P and the resulting semiconductor device 100 that includes such a PMOS device 100P.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a PMOS device with source/drain regions that include in-situ doped epitaxial deposited semiconductor materials, such as silicon germanium. In one example, the method includes forming extension implant regions in a PMOS region and a NMOS region of a semiconducting substrate for a PMOS device and a NMOS device, respectively and, after forming the extension implant regions, performing a first heating process. The method further includes forming a plurality of cavities in the PMOS region of the substrate, performing at least one epitaxial deposition process to form a plurality of in-situ doped semiconductor layers that are positioned in or above each of said cavities, and forming a masking layer that exposes the NMOS region and covers the PMOS region. The method concludes with the steps of forming source/drain implant regions in the NMOS region of the substrate for the NMOS device and performing a second heating process.

In yet another illustrative embodiment the method disclosed herein involves forming extension implant regions in a PMOS region and a NMOS region of a semiconducting substrate for a PMOS device and a NMOS device, respectively, after forming the extension implant regions, performing a first heating process and forming a plurality of cavities in the PMOS region of the substrate. The method further involves performing a first epitaxial deposition process to form a first in-situ doped layer of silicon germanium on at least a bottom surface of each of the cavities, the first layer of silicon germanium having a first dopant concentration of a P-type dopant material, performing a second epitaxial deposition process to form a second in-situ doped layer of silicon germanium on the first layer of silicon germanium, the second layer of silicon germanium having a second dopant concentration of a P-type dopant material that is greater than the first dopant concentration of a P-type dopant material and performing a third epitaxial deposition process to form an in-situ doped layer of silicon on at least the second layer of silicon germanium wherein the layer of silicon has a third dopant concentration of a P-type dopant material that is greater than the first dopant concentration of P-type dopant. This illustrative embodiment concludes with the steps of forming a masking layer that exposes the NMOS region and covers the PMOS region, forming source/drain implant regions in the NMOS region of the substrate for the NMOS device and performing a second heating process.

BRIEF DESCRIPTION OF THE DRAWINGS

The disclosure may be understood by reference to the following description taken in conjunction with the accompanying drawings, in which like reference numerals identify like elements, and in which.

Figure 1A:
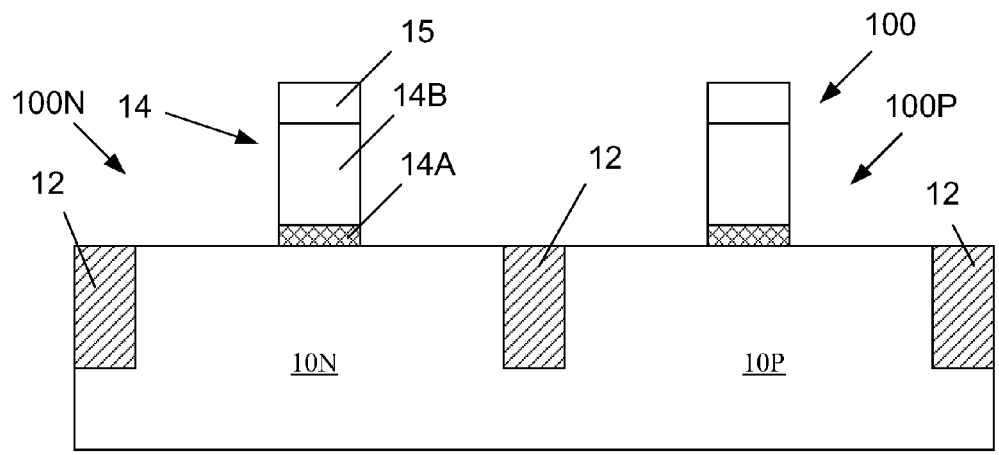
FIGS. 1A-1F schematically depicts an illustrative prior art process flow for forming a semiconductor device that includes illustrative NMOS and PMOS transistors.
Figure 1B:
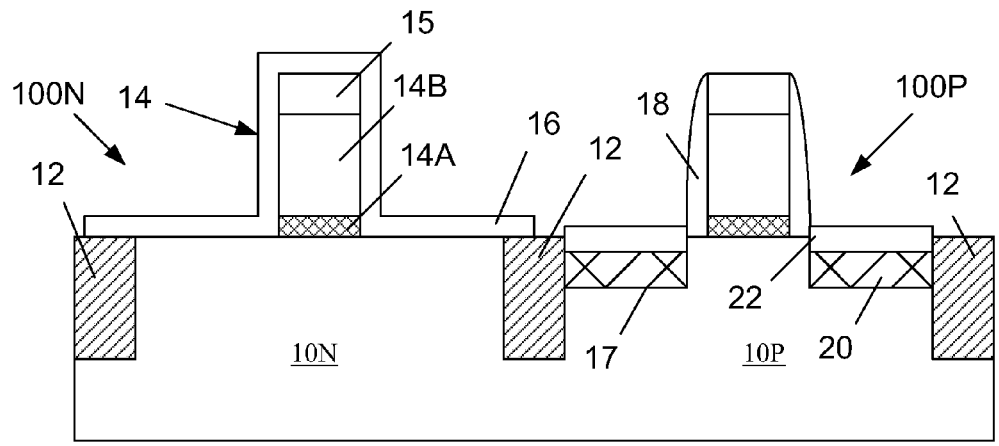
Figure 1C:
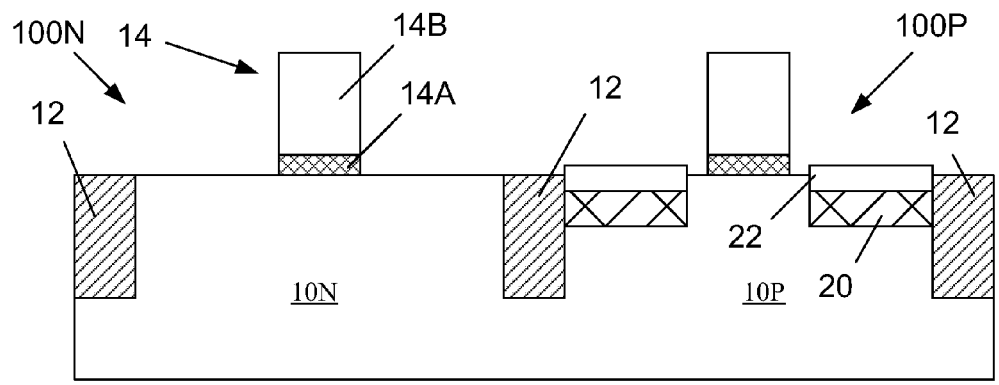
Figure 1D:
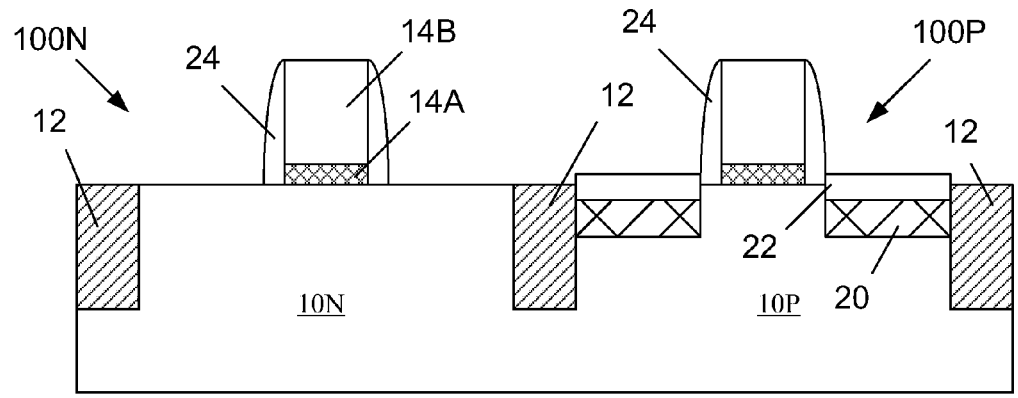
Figure 1E:
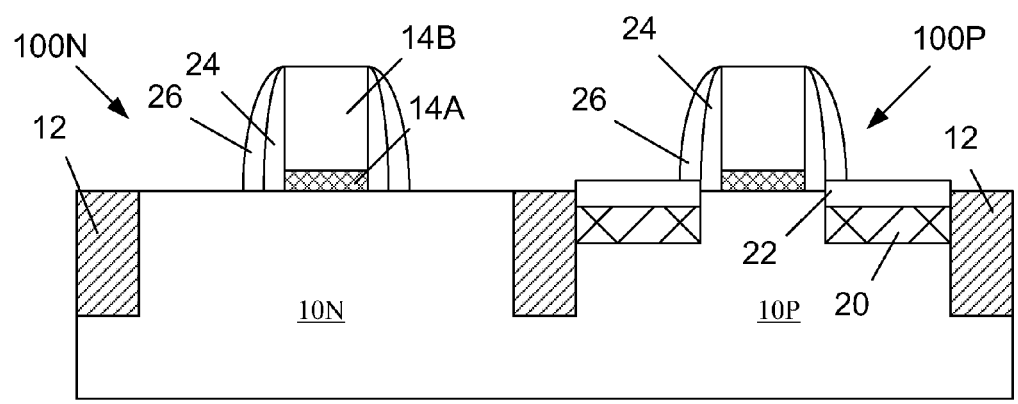
Figure 1F:
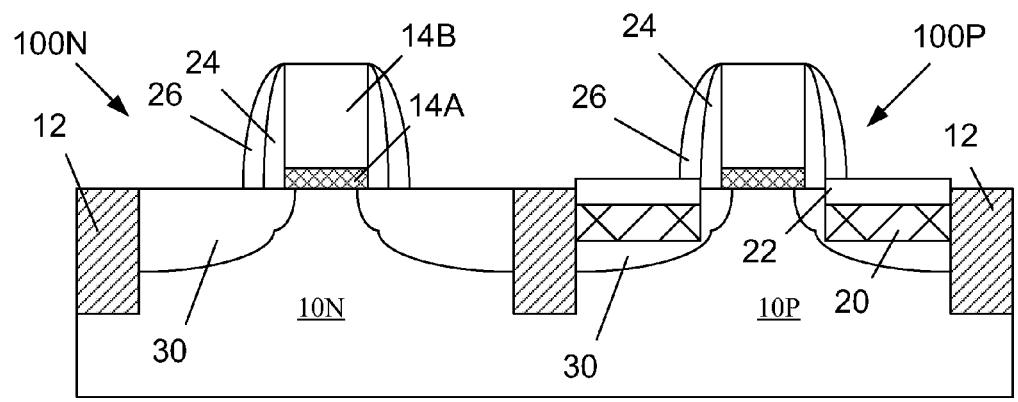

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a PMOS device with source/drain regions that include in-situ doped epitaxial deposited semiconductor materials, such as silicon germanium and the like. As will be readily apparent to those skilled in the art upon a complete reading of the present application, the present method is applicable to a variety of technologies, and is readily applicable to a variety of devices, including, but not limited to, logic devices, memory devices, resistors, conductive lines, etc. The present subject matter may also be employed with a variety of other techniques used in manufacturing semiconductor devices such as so-called "gate-first" and "gate-last" manufacturing techniques. With reference to FIGS. 2A-2I, further illustrative embodiments will now be described in more detail, wherein reference may also be made to FIGS. 1A-1F, if required. To the extent that the same reference numbers are used in FIGS. 1A-1F and FIG. 2A-2I, they referenced structure should be understood to be as previously described.

Figure 2A:
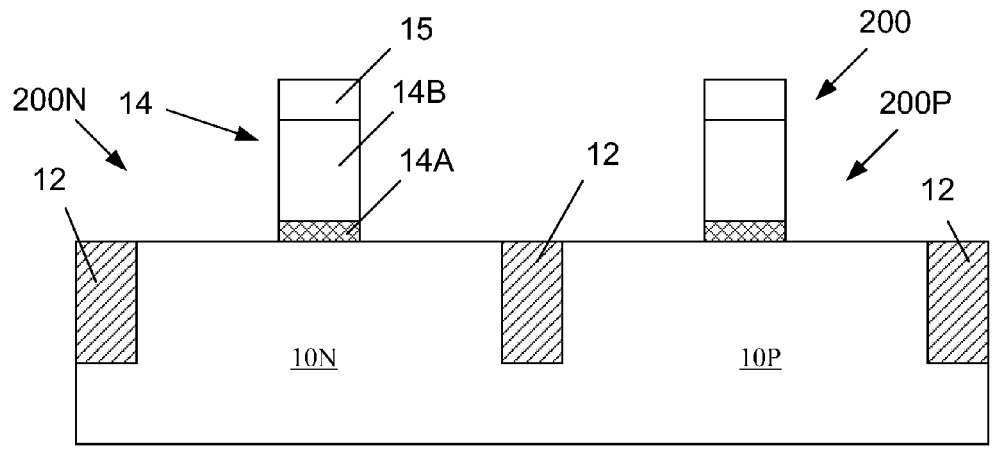
FIGS. 2A-2I depict one illustrative example of the novel devices and process flows described herein.

FIG. 2A is a simplified view of an illustrative semiconductor device 200 according to the present disclosure at an early stage of manufacturing. The device 200 is formed above a semiconducting substrate 10 and it generally includes an illustrative PMOS transistor 200P and an illustrative NMOS transistor 200N formed in and above an PMOS region 10P and an NMOS region 10N, respectively, of the substrate 10. The illustrative transistors 200N, 200P are separated by an illustrative isolation structure 12, e.g., a shallow trench isolation structure, formed in the substrate 10. In one illustrative embodiment, the semiconducting substrate 10 is comprised of bulk silicon. However, the substrate 10 may have a variety of other configurations, like a silicon-on-insulator (SOI) structure that has a bulk silicon layer, a buried insulation layer and an active layer. Thus, the term substrate or semiconducting substrate should be understood to include all forms and composition of semiconductor materials that may be employed in manufacturing integrated circuit devices.

At the point of fabrication depicted in FIG. 2A, each of the PMOS transistor 200P and the NMOS transistor 200N includes a illustrative gate electrode structure 14 that includes an illustrative gate insulation layer 14A and an illustrative gate electrode 14B. Also depicted in FIG. 2A is an illustrative gate cap layer 15, such as silicon nitride. The materials of construction for the gate electrode structures 14 may be different for the PMOS transistor 200P and the NMOS transistor 200N. For example, the NMOS transistor 200N may have a gate insulation layer 14A comprised of silicon dioxide and a gate electrode 14B made of polysilicon, while the PMOS transistor 200P may have a gate insulation layer 14A comprised of a high-k (k greater than 10) dielectric material and a gate electrode 14B made of one or more layers of metal. The configuration and composition of these structures may also vary depending upon the application, and they may be manufactured using techniques well known to those skilled in the art, e.g., deposition of the appropriate layers of material followed by performing one or more etching processes to define the gate electrode structures 14 with the gate cap layer 15 positioned thereabove. Thus, the particular materials of construction of the gate electrode structures 14, and the manner in which they are made, should not be considered a limitation of the present invention.

Figure 2B:
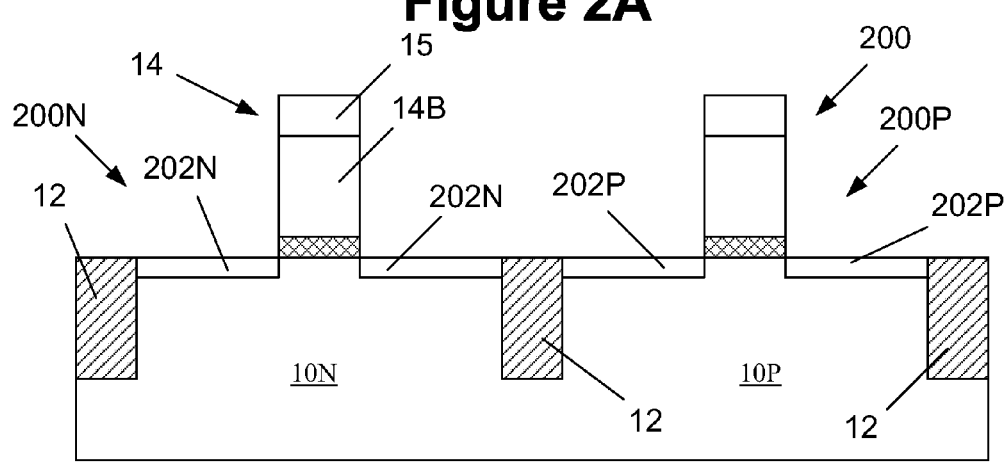

Next, as shown in FIG. 2B, extension implant regions 202N, 202P are formed for the NMOS transistor 200N and the PMOS transistor 200P. Such regions 202N, 202P are formed by performing known ion implantation techniques while masking one to the regions 10N or 10P with a masking layer, such as a photoresist masking layer. The extension implant region 202N will be implanted with a N-type dopant material, such as arsenic or phosphorous. The dopant concentration of the N-type dopants may vary depending on the particular application. Conversely, the extension implant region 202P will be implanted with a P-type dopant material, such as boron or boron difluoride. The dopant concentration of the P-type dopants may vary depending on the particular application. In the illustrative example depicted in FIG. 2B, there are no sidewall spacers adjacent either of the gate electrode structures 14. However, depending upon the particular application, one or more sidewall spacers may be formed adjacent to one or both of the gate electrode structures prior to performing the ion implant processes that are performed to form the extension implant regions 202P, 202N. Thereafter, a first heating process is performed to repair damage to the lattice structure of the substrate 10 as a result of forming the extension implant regions 202P, 202N, and to activate the implanted dopant material. The first heating process may be either a rapid thermal anneal process (RTA) performed at a temperature of approximately 800-900 C. for a duration of a few seconds, or it may be an ultra-fast anneal process (UFA) performed at a temperature of approximately 1200-1300 C. for a very brief period of time, such from 1-10 milliseconds.

Figure 2C:
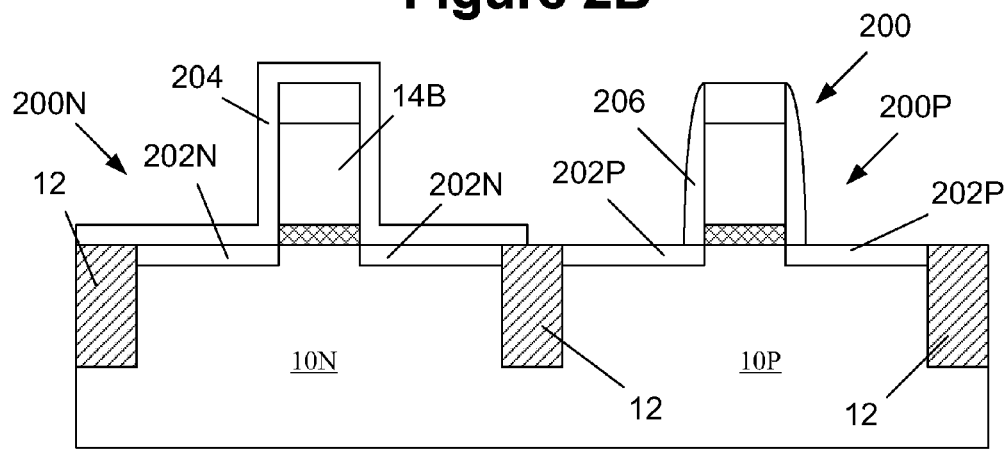

Next, as shown in FIG. 2C, a layer of spacer material 204 is blanket-deposited above the device 200. A mask layer (not shown) is then formed above the NMOS region 10N and an anisotropic etching process is performed on the exposed layer of spacer material 204 to form the illustrative sidewall spacers 206. The size of the spacers 206 may vary depending upon the particular application. The purpose of the spacers 206 is to properly position the location of some cavities that will be formed in the substrate 10 in the PMOS region 10P, as described more fully below. The layer of spacer material 203 may be made from a variety of materials, such as silicon nitride.

Figure 2D:
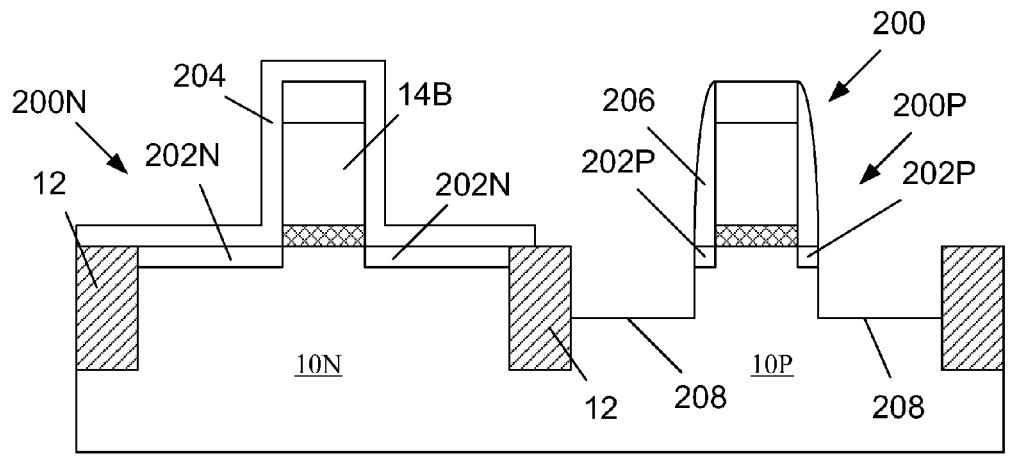

FIG. 2D depicts the device 200 at the point of fabrication where a plurality of cavities 208 have been formed in the substrate 10 in the PMOS region 10P of the substrate 10 proximate the gate electrode structure 14. The cavities 208 may be formed by performing one or more known etching processes on the exposed portions of the substrate 10. The depth and width of the cavities 206 may vary depending upon the particular application. In one illustrative embodiment, the depth of the cavities 206 may be approximately 60-80 nm.

Figure 2E:
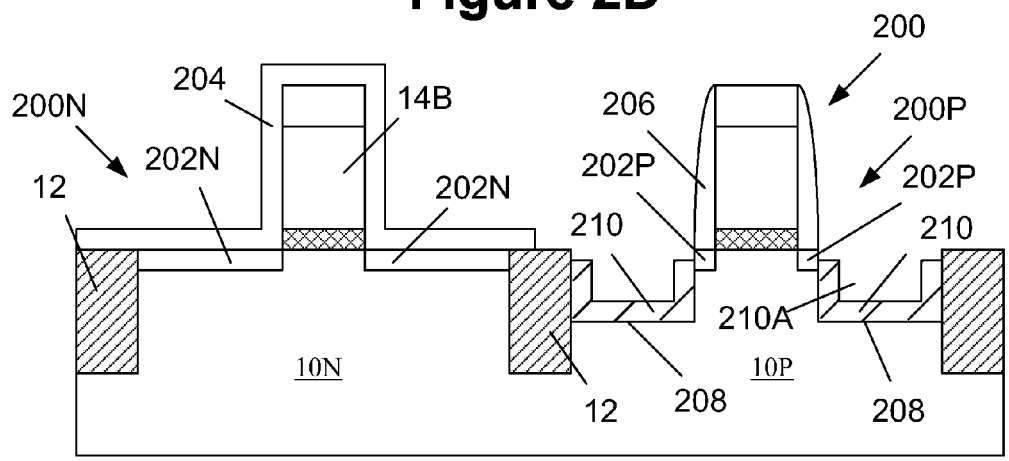

Next, as shown in FIG. 2E, a first layer of semiconductor material 210 is formed in the cavities 206. The first layer of semiconductor material 210 may be comprised of, for example, silicon germanium, etc., and it may have a thickness ranging from approximately 20-40 nm. In one illustrative embodiment, the first layer of semiconductor material 210 may be formed by performing a epitaxial deposition process wherein the first layer of semiconductor material 210 is doped during the deposition process, in situ, with a P-type dopant material, such as boron or boron difluoride. The dopant concentration of the first layer of semiconductor material 210 may vary depending upon the particular application. For example, the dopant concentration of P-type dopant in the first layer of semiconductor material 210 may range from approximately $1e^{19}$-$5e^{19}$ ions/cm$^3$. In one particular embodiment, the first layer of semiconductor material 210 may have germanium concentration of less than 25%, e.g., about 20%. In the depicted example, the first layer of semiconductor material 210 has a generally U-shaped configuration with a partial opening 210A.

Figure 2F:
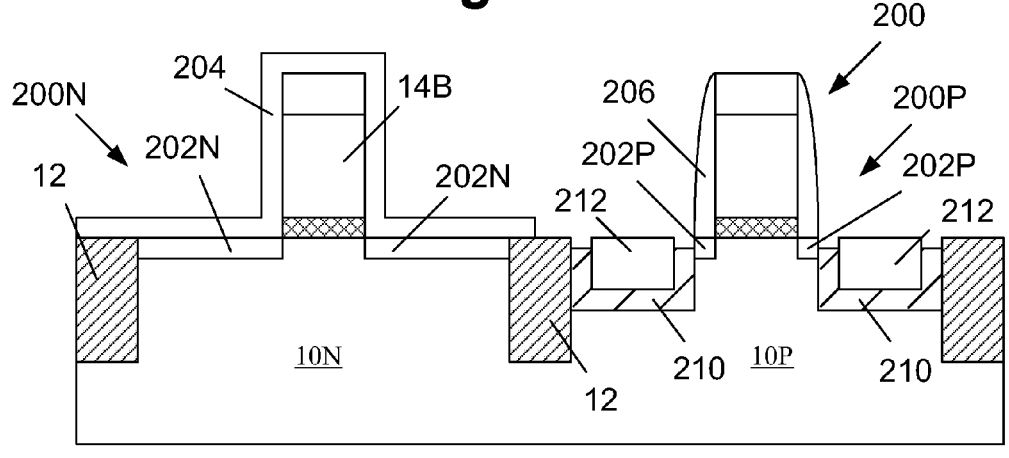

Next, as shown in FIG. 2F, a second layer of semiconductor material 212 is formed in the cavities 206 on the first layer of semiconductor material 210. The second layer of semiconductor material 212 may be comprised of, for example, silicon germanium, etc., and it may have a thickness ranging from approximately 30-50 nm. In one illustrative embodiment, the second layer of semiconductor material 212 may be formed by performing a epitaxial deposition process wherein the second layer of semiconductor material 212 is doped during the deposition process, in situ, with a P-type dopant material, such as boron or boron difluoride. The dopant concentration of the second layer of semiconductor material 212 may vary depending upon the particular application. For example, the dopant concentration of P-type dopant in the second layer of semiconductor material 212 may range from approximately $2e^{20}$-$5e^{20}$ ions/cm$^3$. It is to be noted that the dopant concentration of the second layer of semiconductor material 212 is generally greater than the dopant concentration of the first layer of semiconductor material 210. It should also be noted that second layer of semiconductor material 212 and the first layer of semiconductor material 210 may be doped with the same or different P-type dopant material. In one example, the first layer of semiconductor material 210 and the second layer of semiconductor material 212 are both doped with boron. In one particular embodiment, the second layer of semiconductor material 212 may have germanium concentration greater than 30%, e.g., about 35%. Note that, in this example, the germanium concentration of the second layer of semiconductor material 212 is greater than the germanium concentration of the first layer of semiconductor material 210. In the depicted example, the second layer of semiconductor material 212 is at least partially positioned within the partial opening 210A in the first layer of semiconductor material 210.

Figure 2G:
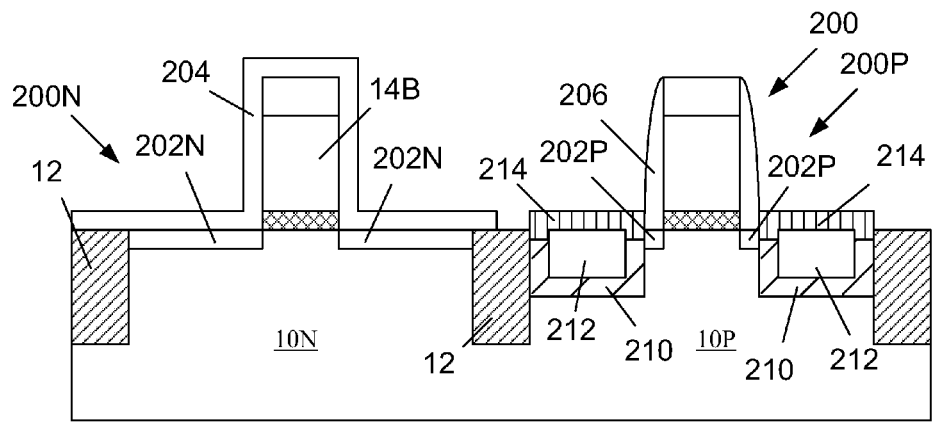

Then, as shown in FIG. 2G, a third layer of semiconductor material 214 is formed at least on the second layer of semiconductor material 212. The third layer of semiconductor material 214 may be comprised of, for example, silicon, etc., and it may have a thickness ranging from approximately 15-20 nm. In one illustrative embodiment, the third layer of semiconductor material 214 may be formed by performing a epitaxial deposition process wherein the third layer of semiconductor material 214 is doped during the deposition process, in situ, with a P-type dopant material, such as boron or boron difluoride. The dopant concentration of the third layer of semiconductor material 214 may vary depending upon the particular application. For example, the dopant concentration of P-type dopant in the third layer of semiconductor material 214 may range from approximately $2e^{20}$-$5e^{20}$ ions/cm$^3$. It is to be noted that the dopant concentration of the third layer of semiconductor material 214 is generally greater than the dopant concentration of the first layer of semiconductor material 210. In some embodiments, the P-type dopant concentration of the third layer of semiconductor material 214 and the second layer of semiconductor material 212 may be approximately the same, or they may have difference dopant concentrations. It should also be noted that the third layer of semiconductor material 214, the second layer of semiconductor material 212 and the first layer of semiconductor material 210 may be doped with the same or different P-type dopant material. In one example, the first layer of semiconductor material 210 and the third layer of semiconductor material 214 are both doped with boron.

Figure 2H:
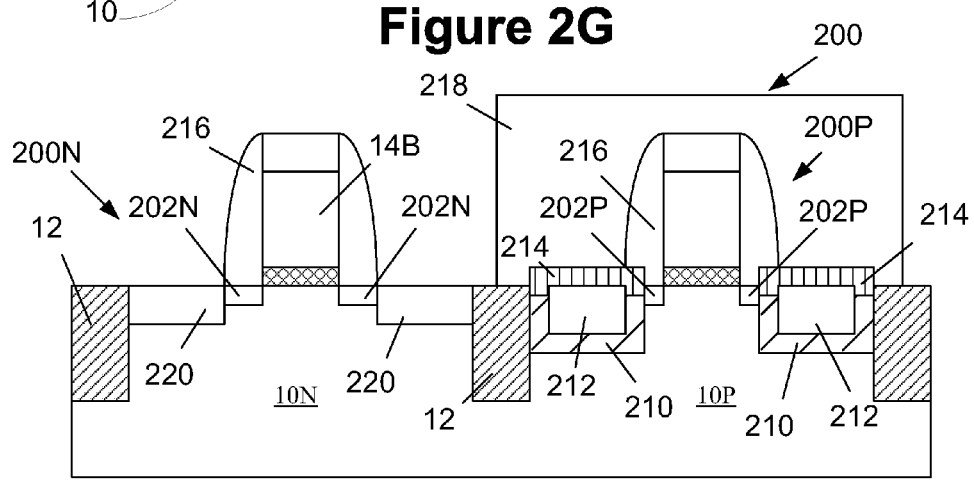

Next, as shown in FIG. 2H, illustrative sidewall spacers 216 are formed adjacent the gate electrode structures 14 of the NMOS transistor 200N and the PMOS transistor 200P. For purposes of illustration, only a single sidewall spacer 216 is depicted although those skilled in the art, after reading the present application, will recognize that, in practice, there may be more than one spacer formed proximate the gate electrode structures. The size of the spacers 216 may vary depending upon the particular application. One of the purposes of the spacers 216 is to properly position the location of source/drain implant regions that will be formed in the substrate 10 in the NMOS region 10N, as described more fully below. The spacers 216 may be made from a variety of materials, such as silicon nitride. After the spacers 216 are formed, a masking layer 218, e.g., a photoresist mask, is formed that exposes the NMOS region 10N and covers the PMOS region 10P.

Then, source/drain implant regions 220 are formed for the NMOS device 200N by performing a known ion implantation process. The source/drain implant regions 220 are implanted with a N-type dopant material, such as arsenic or phosphorous. The dopant concentration of the N-type dopants in the source/drain implant regions 220 may vary depending on the particular application. Thereafter, a second heating process is performed to repair damage to the lattice structure of the substrate 10 in the NMOS region 10N as a result of forming the source/drain implant regions 220, and to activate the implanted dopant material. The second heating process may be an ultra-fast anneal process (UFA) heating process performed at a temperature of approximately 1200-1300 C. for a very brief period of time, such from 1-10 milliseconds.

Figure 2I:
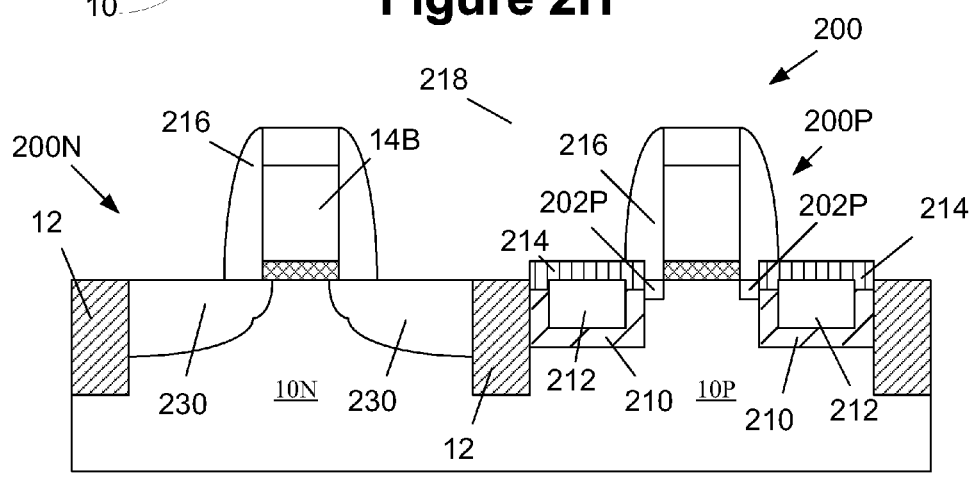

Next, as shown in FIG. 2I, the masking layer 218 is removed. As a result of the processing described above, the NMOS device 200N comprises completed source/drain regions 230. Note that, since the P-type dopant materials were introduced, in situ, the third layer of semiconductor material 214, the second layer of semiconductor material 212 and the first layer of semiconductor material 210, and since a relatively fast UFA was performed to activate the dopants in the source/drain implant regions 220, the third layer of semiconductor material 214, the second layer of semiconductor material 212 and the first layer of semiconductor material 210 are not subjected to extended heat treatments which would otherwise tend to cause one of more of those layers to relax, thereby reducing the amount of compressive stress one or more of those layers applies to the channel region of the PMOS device 200P. By avoiding or at least reducing the undesirable relaxation of one or more of those layers, the performance of the resulting PMOS device 200P, and the semiconductor device 200, incorporation such a PMOS transistor may be improved relative to prior art devices. Additionally, the in situ doping of the second layer of semiconductor material 212 and the first layer of semiconductor material 210 allows for the incorporation of additional germanium content which enables such layers to exhibit a higher compressive stress in the channel region of the PMOS device 200P which may lead to improved device performance. After the point depicted in FIG. 2I, the device 200 may be subjected to additional processing operations to complete the formation of the device 200, e.g., the formation of metal silicide regions and additional contact and metallization levels, etc.

As will be recognized by those skilled in the art after a complete reading of the present application, the novel methods disclosed herein may be employed in various processing schemes. For example, the illustrative methods disclosed herein may be employed in either a "gate-first" or a "gate-last" processing technique. Thus, the present invention should not be considered as limited to any illustrative process flow or details described herein. Additionally, if desired, the methods disclosed herein could also be employed with PMOS devices have embedded SiGe regions in the channel region of such a device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a PMOS device and an NMOS device in and above a PMOS region and an NMOS region, respectively, of a semiconducting substrate, the method comprising:

forming extension implant regions in said PMOS region and said NMOS region of said semiconducting substrate for said PMOS device and said NMOS device, respectively;
after forming said extension implant regions, performing a first heating process;
forming a plurality of cavities in said PMOS region of said substrate;
performing at least one epitaxial deposition process to form a plurality of in-situ doped semiconductor layers that are positioned in or above each of said cavities;
forming a masking layer that exposes said NMOS region and covers said PMOS region;
after forming said plurality of said in-situ doped semiconductor layers, forming source/drain implant regions in said NMOS region of said substrate for said NMOS device; and
after forming said source/drain implant regions in said NMOS region, performing a second heating process.

2. The method of claim 1, wherein performing said at least one epitaxial deposition process to form a plurality of in-situ doped semiconductor layers comprises:
forming a first semiconductor layer on at least a bottom surface of each of said cavities, said first semiconductor layer having a first dopant concentration of a P-type dopant material; and
forming a second semiconductor layer on said first semiconductor layer, said second semiconductor layer having a second dopant concentration of a P-type dopant material that is greater than said first dopant concentration of P-type dopant.

3. The method of claim 2, wherein said first layer of semiconductor material is a layer of silicon germanium with a first concentration of germanium, and said second layer of semiconductor material is a layer of silicon germanium having a second concentration of germanium that is greater than said first concentration of germanium.

4. The method of claim 3, wherein said first concentration of germanium is 25% or less and said second concentration of germanium that is 30% or greater.

5. The method of claim 4, wherein each of said plurality of in-situ doped semiconductor layers is doped with a P-type dopant material.

6. The method of claim 2, wherein said first dopant concentration of P-type dopant material ranges from $1e^{19}$-$5e^{19}$ ions/cm$^3$, and said second dopant concentration of P-type dopant material ranges from $2e^{20}$-$5e^{20}$ ions/cm$^3$.

7. The method of claim 2, wherein performing said at least one epitaxial deposition process to form a plurality of in-situ doped semiconductor layers further comprises forming a third layer of semiconductor material on at least said second layer of semiconductor material, said third layer of semiconductor material having a third dopant concentration of a P-type dopant material that is greater than said first dopant concentration of P-type dopant.

8. The method of claim 7, wherein said second and third dopant concentrations of a P-type dopant material are approximately the same.

9. The method of claim 1, where each of said plurality of in-situ doped semiconductor layers are doped with the same P-type dopant material.

10. The method of claim 9 wherein said dopant material is boron.

11. The method of claim 1, wherein said first heating process is one of a rapid thermal anneal process or an ultra-fast anneal process.

12. The method of claim 1, wherein said second heating process is an ultra-fast anneal process performed at a temperature of at least approximately 1200-1300 C for a duration of at least one millisecond.

13. A method of forming a PMOS device and an NMOS device in and above a PMOS region and an NMOS region, respectively, of a semiconducting substrate, the method comprising:

forming extension implant regions in said PMOS region and said NMOS region of said semiconducting substrate for said PMOS device and said NMOS device, respectively;

after forming said extension implant regions, performing a first heating process;

forming a plurality of cavities in said PMOS region of said substrate;

performing a first epitaxial deposition process to form a first in-situ doped layer of silicon germanium on at least a bottom surface of each of said cavities, said first layer of silicon germanium having a first dopant concentration of a P-type dopant material;

performing a second epitaxial deposition process to form a second in-situ doped layer of silicon germanium on said first layer of silicon germanium, said second layer of silicon germanium having a second dopant concentration of a P-type dopant material that is greater than said first dopant concentration of a P-type dopant material;

performing a third epitaxial deposition process to form an in-situ doped layer of silicon on at least said second layer of silicon germanium wherein said layer of silicon has a third dopant concentration of a P-type dopant material that is greater than said first dopant concentration of P-type dopant;

forming a masking layer that exposes said NMOS region and covers said PMOS region;

after performing said third epitaxial deposition process, forming source/drain implant regions in said NMOS region of said substrate for said NMOS device; and after forming said source/drain implant regions in said NMOS region, performing a second heating process.

14. The method of claim 13, wherein said first layer of silicon germanium has a first concentration of germanium, and said second layer of silicon germanium having a second concentration of germanium that is greater than said first concentration of germanium.

15. The method of claim 14, wherein said first concentration of germanium is 25% or less and said second concentration of germanium that is 30% or greater.

16. The method of claim 13, wherein said first dopant concentration of P-type dopant material ranges from $1e^{19}$-$5e^{19}$ ions/cm$^3$, and said second dopant concentration of P-type dopant material ranges from $2e^{20}$-$5e^{20}$ ions/cm$^3$.

17. The method of claim 13, wherein said second and third dopant concentrations of a P-type dopant material are approximately the same.

18. The method of claim 16, where each of said first layer of silicon germanium, said second layer of silicon germanium and said layer of silicon are doped with the same P-type dopant material.

19. The method of claim 18 wherein said dopant material is boron.

20. The method of claim 13, wherein said first heating process is one of a rapid thermal anneal process or an ultra-fast anneal process.

21. The method of claim 13, wherein said second heating process is an ultra-fast anneal process performed at a temperature of at least approximately 1200-1300 C for a duration of at least one millisecond.

* * * * *